(12) United States Patent
Tierney et al.

(10) Patent No.: US 8,173,766 B2
(45) Date of Patent: May 8, 2012

(54) POLYMERS DERIVED FROM BIS(THIENOCYCLOPENTA) BENZOTHIADIAZOLE AND THEIR USE AS ORGANIC SEMICONDUCTORS

(75) Inventors: Steven Tierney, Southampton (GB); Clare Bailey, Southampton (GB); William Mitchell, Chandler's Ford (GB)

(73) Assignee: Merck Patent Gesellschaft mit beschrankter Haftung, Darmstadt (DE)

( * ) Notice: Subject to any disclaimer, the term of this patent is extended or adjusted under 35 U.S.C. 154(b) by 0 days.

(21) Appl. No.: 13/119,820

(22) PCT Filed: Aug. 20, 2009

(86) PCT No.: PCT/EP2009/006046
§ 371 (c)(1),
(2), (4) Date: Mar. 18, 2011

(87) PCT Pub. No.: WO2010/031479
PCT Pub. Date: Mar. 25, 2010

(65) Prior Publication Data
US 2011/0178236 A1    Jul. 21, 2011

(30) Foreign Application Priority Data
Sep. 19, 2008   (EP) .................................... 08016528

(51) Int. Cl.
*C08G 64/00* (2006.01)
*C08G 65/40* (2006.01)

(52) U.S. Cl. ........................................ 528/370; 528/211
(58) Field of Classification Search .................. 528/370
See application file for complete search history.

(56) References Cited

U.S. PATENT DOCUMENTS
8,008,424 B2 * 8/2011 Gaudiana et al. ............. 528/289

OTHER PUBLICATIONS

Chen, Chih-Ping et al.: "Low-Bandgap Poly(Thiophene-Phenylene-Thiophene) Derivatives with Broaden Absorption Spectra for Use in High-Performance Bulk-Heterojunction Polymer Solar Cells," Journal of the American Chemical Society, vol. 130 (Aug. 29, 2009) pp. 12828-12833, XP002550809.
Zhao, Chunchang, et al.: "4, 9-Dihiydro-s-indaceno[1,2-b:5,6-b]dithiophene-4, 9-dione Functionalized Copolymers for Organic Photovoltaic Devices," Journal of Polymer Science Part A: Polymer Chemistry, vol. 46 (Apr. 15, 2008) pp. 2680-2688, XP002550805.
Liu, Cheng-Liang, et al.: "New Didecyloxyphenylene-Acceptor Alternating Conjugated Copolymers: Synthesis, Properties, and Optoelectronic Device Applications," Macromolecules, vol. 41 (Aug. 27, 2008) pp. 6952-6959, XP002557068.
International Search Report, mailed Dec. 8, 2009, issued in corresponding PCT/EP2009/006046.

* cited by examiner

*Primary Examiner* — Terressa Boykin
(74) *Attorney, Agent, or Firm* — Millen, White, Zelano & Branigan, P.C.

(57) ABSTRACT

The invention relates to conjugated polymers comprising bis(thienocyclopenta)benzothiadiazole units or derivatives thereof, to methods of their preparation, to novel monomer units used therein, to the use of the polymers in organic electronic (OE) devices, and to OE devices comprising the polymers.

17 Claims, No Drawings

POLYMERS DERIVED FROM BIS(THIENOCYCLOPENTA) BENZOTHIADIAZOLE AND THEIR USE AS ORGANIC SEMICONDUCTORS

FIELD OF THE INVENTION

The invention relates to conjugated polymers comprising bis(thienocyclopenta)benzothiadiazole units or derivatives thereof, to methods of their preparation, to novel monomer units used therein, to the use of the polymers in organic electronic (OE) devices, and to OE devices comprising the polymers.

BACKGROUND AND PRIOR ART

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), photodetectors, organic photovoltaic (OPV) cells, sensors, memory elements and logic circuits to name just a few. The organic semiconducting materials are typically present in the electronic device in the form of a thin layer, for example less than 1 micron thick.

The performance of OFET devices is principally based upon the charge carrier mobility of the semiconducting material and the current on/off ratio, so the ideal semiconductor should have a low conductivity in the off state, combined with a high charge carrier mobility ($>1\times10^{-3}$ cm$^2$ V$^{-1}$ s$^{-1}$). In addition, it is important that the semiconducting material is relatively stable to oxidation i.e. it has a high ionisation potential, as oxidation leads to reduced device performance. Further requirements for the semiconducting material are a good processability, especially for large-scale production of thin layers and desired patterns, and high stability, film uniformity and integrity of the organic semiconductor layer.

In prior art various materials have been proposed for use as OSCs in OFETs, including small molecules like for example pentacene, and polymers like for example polyhexylthiophene. However, the materials and devices investigated so far do still have several drawbacks, and their properties, especially the processability, charge-carrier mobility, on/off ratio and stability do still leave room for further improvement.

There is especially a strong need for novel p-type organic semiconductor for application in bulk heterojunction photovoltaics that can yield improved device performance. The limitations of existing p-type materials relate to deficiencies in light absorption, oxidative stability and charge-carrier mobility.

State-of-the-art p-type materials for bulk heterojunction photovoltaics include poly(3-hexylthiophene) (P3HT) and poly[2,6-(4,4-bis(2-ethylhexyl)-4H-cyclopenta[2,1-b;3,4-b']-dithiophene)-alt-4,7-(2,1,3-benzothiadiazole)] (PCP-DTBT) as shown below:

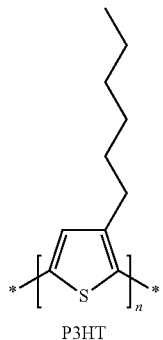

P3HT

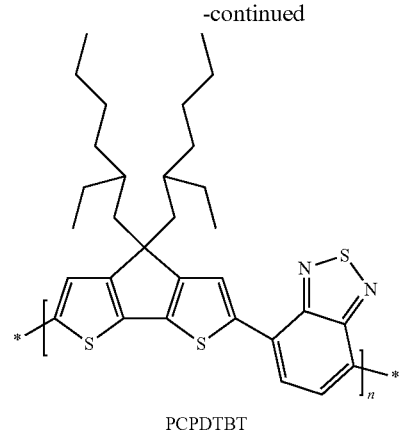

PCPDTBT

P3HT is strongly limited by the onset of its absorption profile (~650 nm) that limits its ability to absorb light from the solar spectrum. Furthermore, the energy of P3HT's HOMO energy level renders it susceptible to oxidative doping. PCP-DTBT has an improved absorption profile compared to P3HT, with an absorption onset of 890 nm [see Z. Zhu, D. Waller, R. Gaudiana, M. Morana, D. Muhlbacher, M. Scharber and C. Brabec, *Macromolecules*, 2007, 40, 1981] however it suffers from a lower intrinsic mobility, which was reported to be in the region of 10$^{-2}$ cm$^2$/Vs [see above citation] and a poorer morphology when blended with the commonly used n-type material PCBM, [see D. Muhlbacher, M. Scharber, M. Morana, Z. Zhu, D. Waller, R. Gaudiana and C. Brabec, *Adv. Mater.*, 2006, 18, 2884] in comparison to optimised P3HT: PCBM blends.

Therefore, there is still a need for improved p-type organic semiconductors, especially for use in bulk heterojunction OPV devices, which do not have the drawbacks of the materials of prior art. In particular, the new materials should demonstrate the following properties:

low bandgap, high charge carrier mobility, being easy to synthesize, high solubility in organic solvents, good processability for the device manufacture process, high oxidative stability, long lifetime in electronic devices.

One aim of the present invention is to provide new p-type OSC materials, especially for use in bulk heterojunction OPV devices, fulfilling the above-mentioned requirements. Another aim is to extend the pool of OSC materials available to the expert. Other aims of the present invention are immediately evident to the expert from the following detailed description.

The inventors of the present invention have found that these aims can be achieved by providing materials as described hereinafter, which represent a novel class of conjugated polymer based upon the bis(thienocyclpenta) benzothiadiazole unit and derivatives thereof.

SUMMARY OF THE INVENTION

The invention relates to conjugated polymers comprising one or more identical or different repeating units of formula I

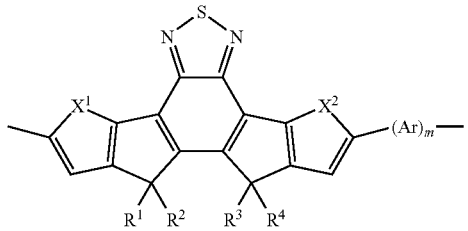

wherein $X^1$ and $X^2$ denote independently of each other S, Se or —$CR^1$=$CR^2$—, $R^{1-4}$ are identical or different groups independently of each other selected from H, halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, P-Sp-, optionally substituted silyl, or carbyl or hydrocarbyl with 1 to 40 C atoms that is optionally substituted and optionally comprises one or more hetero atoms, P is a polymerisable group, Sp is a spacer group or a single bond, $X^0$ is halogen, $R^0$ and $R^{00}$ are independently of each other H or an optionally substituted carbyl or hydrocarbyl group optionally comprising one or more hetero atoms, Ar is in each occurrence independently of one another are an optionally substituted aryl or heterorayl group, —CY$^1$=CY$^2$— or —C≡C—, $Y^1$ and $Y^2$ are independently of each other H, F, Cl or CN, m is in each occurrence independently of one another 0, 1, 2, 3 or 4.

The invention further relates to a formulation comprising one or more polymers or polymer blends according to the present invention and one or more solvents, preferably selected from organic solvents.

The invention further relates to a polymer blend comprising one or more polymers according to the present invention and one or more polymers, preferably selected from polymers having semiconducting, charge transport, hole/electron transport, hole/electron blocking, electrically conducting, photoconducting or light emitting properties.

The invention further relates to the use of polymers, polymer blends and formulations according to the present invention as charge transport, semiconducting, electrically conducting, photoconducting or light emitting material in optical, electrooptical, electronic, electroluminescent or photoluminescent components or devices.

The invention further relates to a charge transport, semiconducting, electrically conducting, photoconducting or light emitting material or component comprising one or more polymers, polymer blends of formulations according to the present invention.

The invention further relates to an optical, electrooptical or electronic component or device comprising one or more polymers, polymer blends, formulations, components or materials according to the present invention.

The optical, electrooptical, electronic electroluminescent and photoluminescent components or devices include, without limitation, organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), solar cells, laser diodes, photoconductors, photodetectors, electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

Especially preferred components and devices are bulk heterojunction OPV devices.

DETAILED DESCRIPTION OF THE INVENTION

The polymers according to the present invention are easy to synthesize and exhibit several advantageous properties, like a low bandgap, a high charge carrier mobility, a high solubility in organic solvents, a good processability for the device manufacture process, a high oxidative stability and a long lifetime in electronic devices. In addition, they show the following advantageous properties:

i) The approach to include donor (electron-rich) and acceptor (electron-deficient) units into a polymer structure has been commonly employed to yield a low band-gap polymer ($E_g$). The lowering of the band-gap increases the absorption onset and therefore improves the polymer's absorption profile overlap with the solar spectrum. In the polymers of this invention, the combination of an electron-rich (i.e. thienocyclopenta) and an electron-deficient unit (i.e. benzothiadiazole) within one individual repeat unit leads to a polymer that exhibits a low band-gap, but also some additional improvements.

ii) The bis(thienocyclpenta)benzothiadiazole unit exhibit an extensive co-planar structure and consequently individual polymer chains of the homopolymer, poly[bis(thienocyclpenta)benzothiadiazole] also adopt a highly co-planar structure in the solid-state, which is beneficial for charge transport and should improve charge-carrier mobility.

iii) Additional fine-tuning of the electronic energies can be achieved by either further modification of the bis(thienocyclpenta)-benzothiadiazole core or co-polymerisation with appropriate co-monomer(s). This affords low bandgap polymers that are advantageous in bulk heterojunction photovoltaic cells due to improved light harvesting, and gives way to higher bulk heterojunction cell efficiencies.

iv) Additional solubility can be introduced into the polymer by adding at the cyclopenta bridging positions longer alkyl chains, branched alkyl chains or polyalkoxy ethers or co-monomers containing multiple solubilising groups.

The conjugated polymers are preferably selected of formula Ia

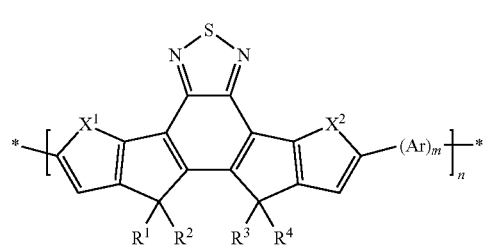

wherein $X^{1,2}$, $R^{1-4}$, Ar and m have the meanings of formula I and n is an integer >1.

Especially preferred are polymers of formula Ib

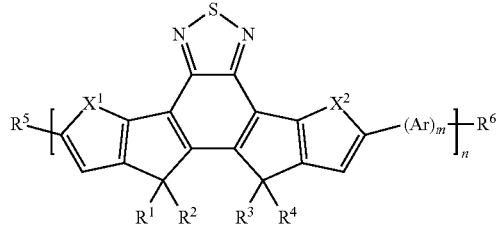

Ib wherein $X^{1,2}$, $R^{1-4}$, Ar, m and n have the meanings of formula Ia, and
$R^5$ and $R^6$ have independently of each other one of the meanings of $R^1$ or denote H, halogen, —CH$_2$Cl, —CHO, —CH=CH$_2$—SiR'R''R''', —SnR'R''R''', —BR'R'', —B(OR')(OR''), —B(OH)$_2$, or P-Sp, wherein P and Sp are as defined above, and R', R'' and R''' have independently of each other one of the meanings of $R^0$ given above and R' and R'' may also form a ring together with the hetero atom to which the are attached.

Especially preferred are polymers comprising one or more identical or different repeating units selected from the group consisting of the following subformulae:

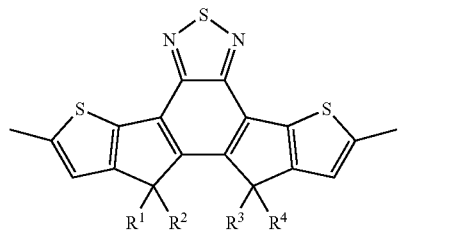

I1

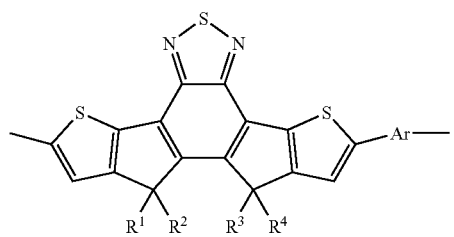

I2

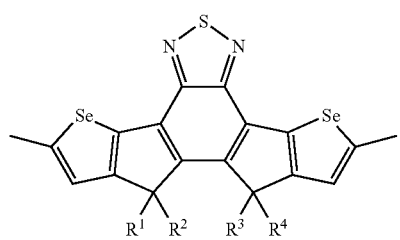

I3

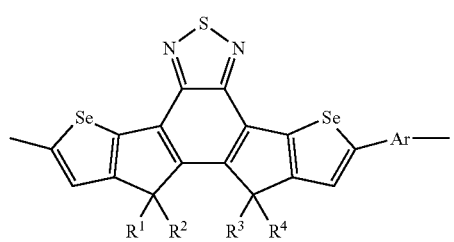

I4

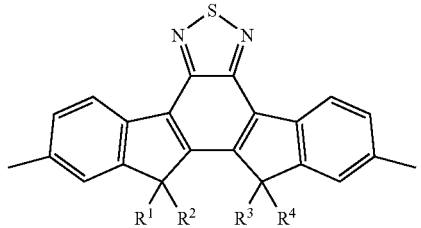

I5

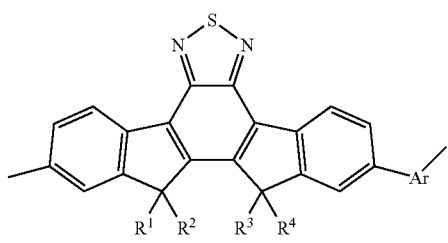

I6 wherein $R^{1-4}$ and Ar are as defined in formula I.

The polymers of formula Ia are preferably selected from the group consisting of the following subformulae:

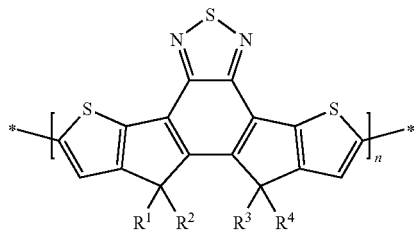

Ia1

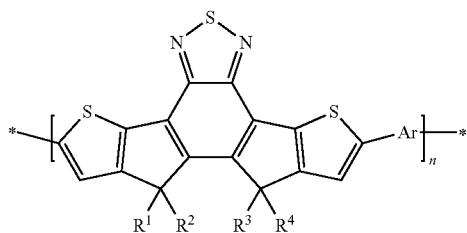

Ia2

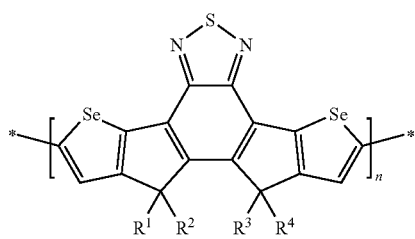

Ia3

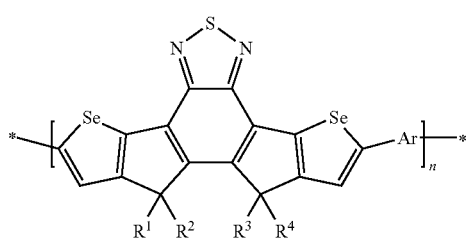

Ia4

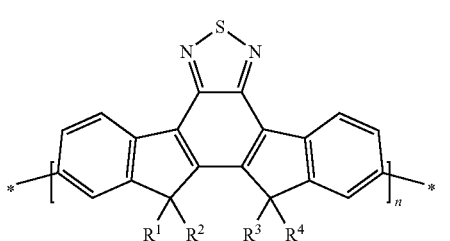

Ia5

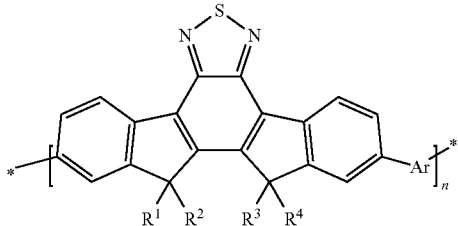

Ia6 wherein R$^{1-4}$, Ar and n are as defined in formula Ia.

Further preferred are polymers selected of formula Ib1:

R$^5$-chain-R$^6$     Ib1 wherein R$^5$ and R$^6$ are as defined in formula Ib, and "chain" is a polymer chain selected from the group consisting of subformulae Ia1-Ia6.

Another aspect of the invention relates to monomers of formula II

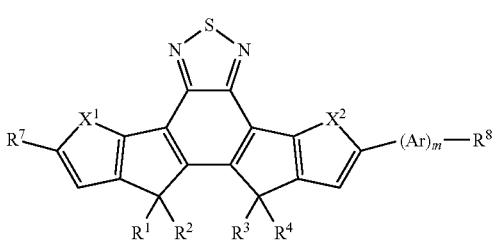

II wherein X$^{1,2}$, R$^{1-4}$, Ar and m have the meanings of formula I, and

R$^7$ and R$^8$ denote independently of each other halogen, —CH$_2$Cl, —CHO, —CH=CH$_2$—SiR'R"R''', —SnR'R"R''', —BR'R", —B(OR')(OR"), —B(OH)$_2$, a leaving group or P-Sp, wherein P and Sp are as defined above, and R', R" and R''' have independently of each other one of the meanings of R$^0$ given above or denote halogen, and R' and R" may also form a ring together with the hetero atom to which the are attached.

Especially preferred are monomers selected of formula III1:

R$^7$-MU-R$^8$     III1 wherein R$^7$ and R$^8$ are as defined in formula II, and "MU" is a monomeric unit selected from the group consisting of subformulae I1-I6.

Further preferred are monomers of formula II wherein m is 0 and monomers of formula III wherein "MU" is a monomeric unit selected from the group consisting of subformulae I1, I3 and I5.

Especially preferred are units of formula I, polymers of formula Ia and Ib, and monomers of formula II, and their preferred subformulae as shown above and below, wherein X$^1$ and X$^2$ denote S, X$^1$ and X$^2$ denote Se, X$^1$ and X$^2$ denote —CR$^1$=CR$^2$—, preferably —CH=CH—, R$^{1-4}$ are independently of each other selected from, preferably straight-chain or branched, C$_1$-C$_{20}$-alkyl, C$_1$-C$_{20}$-alkoxy, C$_2$-C$_{20}$-alkenyl, C$_2$-C$_{20}$-alkynyl, C$_1$-C$_{20}$-thioalkyl, C$_1$-C$_{20}$-silyl, C$_1$-C$_{20}$-ester, C$_1$-C$_{20}$-amino, and C$_1$-C$_{20}$-fluoroalkyl, R$^{1-4}$ are H, m is 0, m is 1 or 2, Ar is selected from aryl or heteroaryl, preferably selected from the group consisting of 2,1,3-benzothiadiazole-4,7-diyl, 2,1,3-benzoselenadiazole-4,7-diyl, 2,3-dicyano-1,4-phenylene, 2,5-dicyano, 1,4-phenylene, 2,3-difluoro-1,4-phenylene, 2,5-difluoro, 1,4-phenylene, 2,3,5,6-tetrafluoro, 1,4-phenylene, 3,4-difluorothiophene-2,5-diyl, thieno[3,4-b]pyrazine-2,5-diyl, quinoxaline-5,8-diyl, selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, 1,4-phenylene, pyridine-2,5-diyl, pyrimidine-2,5-diyl, p-p'-biphenyl, naphthalene-2,6-diyl, benzo[1,2-b:4,5-b']dithiophene-2,6-diyl, 2,2-dithiophene, 2,2-diselenophene, thiazole and oxazole, all of which are unsubstituted, mono- or polysubstituted, preferably with R$^1$ as defined above, especially preferably with m being 1 or 2, n is at least 5, preferably at least 15, very preferably at least 50, and up to 5000, preferably up to 1000, Mw is at least 5,000, preferably at least 10,000, very preferably at least 20,000, and is up to 300,000 preferably up to 200,000, R$^5$ and R$^6$ are selected from H, halogen, —CH$_2$Cl, —CHO, —CH=CH$_2$—SiR'R"R''', —SnR'R"R''', —BR'R", —B(OR')(OR"), —B(OH)$_2$, P-Sp, C$_1$-C$_{20}$-alkyl, C$_1$-C$_{20}$-alkoxy, C$_2$-C$_{20}$-alkenyl, C$_1$-C$_{20}$-fluoroalkyl and optionally substituted aryl or heteroaryl, R$^7$ and R$^8$ are, preferably independently of each other, selected from the group consisting of Cl, Br, I, O-tosylate, O-triflate, O-mesylate, O-nonaflate, —SiMe$_2$F, —SiMeF$_2$, —O—SO$_2$Z, —B(OZ$^1$)$_2$, —CZ$^2$=C(Z$^2$)$_2$, —C≡CH and —Sn(Z$^3$)$_3$, wherein Z and Z$^{1-3}$ are selected from the group consisting of alkyl and aryl, each being optionally substituted, and two groups Z$^1$ may also form a cyclic group, at least one, preferably one or two of R$^{1-4}$ denote P-Sp-.

The polymers of the present invention include homopolymers and copolymers, like statistical or random copolymers, alternating copolymers and block copolymers, as well as combinations thereof.

In the polymers according to the present invention, the total number of repeating units n is preferably ≧5, very preferably ≧15, most preferably ≧50, and preferably up to 1000, very preferably up to 2,000, most preferably up to 5,000, including any combination of the aforementioned lower and upper limits of n.

The term "polymer" generally means a molecule of high relative molecular mass, the structure of which essentially comprises the multiple repetition of units derived, actually or conceptually, from molecules of low relative molecular mass (PAC, 1996, 68, 2291). The term "oligomer" generally means a molecule of intermediate relative molecular mass, the structure of which essentially comprises a small plurality of units derived, actually or conceptually, from molecules of lower relative molecular mass (PAC, 1996, 68, 2291). In a preferred sense according to the present invention a polymer means a compound having >1, preferably ≧5 repeating units, and an oligomer means a compound with >1 and <10, preferably <5, repeating units.

The terms "repeating unit" and "monomeric unit" mean the constitutional repeating unit (CRU), which is the smallest constitutional unit the repetition of which constitutes a regular macromolecule, a regular oligomer molecule, a regular block or a regular chain (PAC, 1996, 68, 2291).

The term "leaving group" means an atom or group (charged or uncharged) that becomes detached from an atom in what is considered to be the residual or main part of the molecule taking part in a specified reaction (see also PAC, 1994, 66, 1134).

The term "conjugated" means a compound containing mainly C atoms with $sp^2$-hybridisation (or optionally also sp-hybridisation), which may also be replaced by hetero atoms. In the simplest case this is for example a compound with alternating C—C single and double (or triple) bonds, but does also include compounds with units like 1,3-phenylene. "Mainly" means in this connection that a compound with naturally (spontaneously) occurring defects, which may lead to interruption of the conjugation, is still regarded as a conjugated compound.

Unless stated otherwise, the molecular weight is given as the number average molecular weight $M_n$ or weight average molecular weight $M_w$, which is determined by gel permeation chromatography (GPC) against polystyrene standards. The degree of polymerization (n) means the number average degree of polymerization, given as $n=M_n/M_U$, wherein $M_U$ is the molecular weight of the single repeating unit.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may also be linear, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be linear or branched. The $C_1$-$C_{40}$ carbyl or hydrocarbyl group includes for example: a $C_1$-$C_{40}$ alkyl group, a $C_2$-$C_{40}$ alkenyl group, a $C_2$-$C_{40}$ alkynyl group, a $C_3$-$C_{40}$ alkyl group, a $C_4$-$C_{40}$ alkyldienyl group, a $C_4$-$C_{40}$ polyenyl group, a $C_6$-$C_{18}$ aryl group, a $C_2$-$C_{18}$ heteroaryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ alkyl group, a $C_4$-$C_{20}$ alkyldienyl group, a $C_6$-$C_{12}$ aryl group, a $C_2$-$C_{12}$ heteroaryl group and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

Further preferred carbyl and hydrocarbyl groups include straight-chain, branched or cyclic alkyl with 1 to 40, preferably 1 to 25 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —NR$^0$—, —SiR$^0$R$^{00}$—, —CO—, —COO—, —OCO—, —O—CO—O—, —S—CO—, —CO—S—, —SO$_2$—, —CO—NR$^0$—, —NR$^0$—CO—, —NR$^0$—CO—NR$^{00}$—, —CY$^1$=CY$^2$— or —C≡C— in such a manner that O and/or S atoms are not linked directly to one another, wherein Y$^1$ and Y$^2$ are independently of each other H, F, Cl or CN, and R$^0$ and R$^{00}$ are independently of each other H or an optionally substituted aliphatic or aromatic hydrocarbon with 1 to 20 C atoms.

R$^0$ and R$^{00}$ are preferably selected from H, straight-chain or branched alkyl with 1 to 12 C atoms or aryl with 6 to 12 C atoms.

—CY$^1$=CY$^2$— is preferably —CH=CH—, —CF=CF— or —CH=C(CN)—.

Halogen is F, Cl, Br or I.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, tetradecyl, hexadecyl, trifluoromethyl, perfluoro-n-butyl, 2,2,2-trifluoroethyl, perfluorooctyl, perfluorohexyl etc.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl etc.

Preferred alkynyl groups include, without limitation, ethynyl, propynyl, butynyl, pentynyl, hexynyl, octynyl etc.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy etc.

Preferred amino groups include, without limitation, dimethylamino, methylamino, methylphenylamino, phenylamino, etc.

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is substantially conjugated over substantially the whole group.

Aryl and heteroaryl preferably denote a mono-, bi- or tricyclic aromatic or heteroaromatic group with up to 25 C atoms that may also comprise condensed rings and is optionally substituted.

Preferred aryl groups include, without limitation, benzene, biphenylene, triphenylene, [1,1':3',1"]terphenyl-2'-ylene, naphthalene, anthracene, binaphthylene, phenanthrene, pyrene, dihydropyrene, chrysene, perylene, tetracene, pentacene, benzpyrene, fluorene, indene, indenofluorene, spirobifluorene, etc.

Preferred heteroaryl groups include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like carbazole, indole, isoindole, indolizine, indazole, benzimidazole, benzotriazole, purine, naphthimidazole, phenanthrimidazole, pyridimidazole, pyrazin-imidazole, quinoxalinimidazole, benzoxazole, naphthoxazole, anthroxa-zole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, dithienopyridine, isobenzothiophene, dibenzothiophene, benzothiadiazothiophene, or combinations thereof. The heteroaryl groups may be substituted with alkyl, alkoxy, thioalkyl, fluoro, fluoroalkyl or further aryl or heteroaryl substituents.

Preferred arylalkyl groups include, without limitation, 2-tolyl, 3-tolyl, 4-tolyl, 2,6-dimethylphenyl, 2,6-diethylphenyl, 2,6-di-1-propylphenyl, 2,6-di-t-butylphenyl, o-t-butylphenyl, m-t-butylphenyl, p-t-butylphenyl, 4-phenoxyphenyl, 4-fluorophenyl, 3-carbomethoxyphenyl, 4-carbomethoxyphenyl etc.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy etc.

The aryl, heteroaryl, carbyl and hydrocarbyl groups optionally comprise one or more substituents, preferably selected from silyl, sulpho, sulphonyl, formyl, amino, imino, nitrilo, mercapto, cyano, nitro, halogen, $C_{1-12}$alkyl, $C_{6-12}$ aryl, $C_{1-12}$ alkoxy, hydroxy and/or combinations thereof. The optional substituents may comprise all chemically possible combinations in the same group and/or a plurality (preferably two) of the aforementioned groups (for example amino and sulphonyl if directly attached to each other represent a sulphamoyl radical).

Preferred substituents include, without limitation, F, Cl, Br, I, —CN, —NO$_2$, —NCO, —NCS, —OCN, —SCN, —C(=O)N$R^{oo}$, —C(=O)$X^o$, —C(=O)$R^o$, —N$R^oR^{oo}$, optionally substituted silyl, aryl with 6 to 40, preferably 6 to 20 C atoms, heteroaryl with 2 to 40, preferably 2 to 20 C atoms, and straight chain or branched alkyl, alkoxy, alkylcarbonyl, alkoxy-carbonyl, alkylcarbonlyoxy or alkoxycarbonyloxy with 1 to 20, preferably 1 to 12 C atoms, wherein one or more H atoms are optionally replaced by F or Cl, wherein $R^o$ and $R^{oo}$ are as defined above and $X^o$ is halogen.

Especially preferred substituents are selected from alkyl, alkoxy, alkenyl, oxaalkyl, thioalkyl, fluoroalkyl and fluoroalkoxy groups as defined for the preferred groups $R^{1,2}$ below.

If one of $R^{1-4}$ is an alkyl or alkoxy radical, i.e. where the terminal CH$_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example. Especially preferred are n-hexyl and n-dodecyl.

If one of $R^{1-4}$ is an alkyl group wherein one or more CH$_2$ groups are replaced by —CH=CH—, this may be straight-chain or branched. It is preferably straight-chain, has 2 to 12 C-atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl, undec-1-, 2-, 3-, 4-, 5-, 6-, 7-, 8-, 9- or undec-10-enyl, dodec-1-, 2-, 3-, 4-, 5-, 6-, 7-, 8-, -9, -10 or undec-11-enyl. The alkenyl group may comprise C=C-bonds with E- or Z-configuration or a mixture thereof.

If one of $R^{1-4}$ is oxaalkyl, i.e. where one CH$_2$ group is replaced by —O—, is preferably straight-chain 2-oxapropyl(=methoxymethyl), 2-(=ethoxymethyl) or 3-oxabutyl(=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

If one of $R^{1-4}$ is thioalkyl, i.e where one CH$_2$ group is replaced by —S—, is preferably straight-chain thiomethyl (—SCH$_3$), 1-thioethyl (—SCH$_2$CH$_3$), 1-thiopropyl(=SCH$_2$CH$_2$CH$_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the CH$_2$ group adjacent to the sp$^2$ hybridised vinyl carbon atom is replaced.

If one of $R^{1-4}$ is fluoroalkyl or fluoroalkoxy, it is preferably a straight-chain group (O)C$_i$F$_{2i+1}$, wherein i is an integer from 1 to 15, in particular CF$_3$, C$_2$F$_5$, C$_3$F$_7$, C$_4$F$_9$, C$_5$F$_{11}$, C$_6$F$_{13}$, C$_7$F$_{15}$ or C$_8$F$_{17}$, very preferably C$_6$F$_{13}$, or the corresponding fluoroalkoxy group.

The polymers may also be substituted with a polymerisable or reactive group, which is optionally protected during the process of forming the polymer. Particular preferred polymers of this type are those of formula I wherein $R^1$ denotes P-Sp. These polymers are particularly useful as semiconductors or charge transport materials, as they can be crosslinked via the groups P, for example by polymerisation in situ, during or after processing the polymer into a thin film for a semiconductor component, to yield crosslinked polymer films with high charge carrier mobility and high thermal, mechanical and chemical stability.

Preferably the polymerisable or reactive group P is selected from CH$_2$=CW$^1$—COO—, CH$_2$=CW$^1$—CO—,

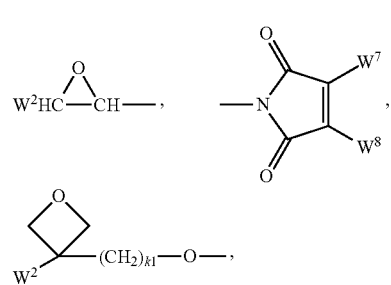

$CH_2$=$CW^2$—(O)$_{k1}$—, $CH_3$—CH=CH—O—, ($CH_2$=CH)$_2$CH—OCO—, ($CH_2$=CH—$CH_2$)$_2$CH—OCO—, ($CH_2$=CH)$_2$CH—O—, ($CH_2$=CH—$CH_2$)$_2$N—, ($CH_2$=CH—$CH_2$)$_2$N—CO—, HO—$CW^2W^3$—, HS—$CW^2W^3$—, $HW^2$N—, HO—$CW^2W^3$—NH—, $CH_2$=$CW^1$—CO—NH—, $CH_2$=CH—(Coo)$_{k1}$-Phe-(O)$_{k2}$—, $CH_2$=CH—(CO)$_{k1}$-Phe-(O)$_{k2}$—, Phe-CH=CH—, HOOC—, OCN—, and $W^4W^5W^6$Si—, with $W^1$ being H, F, Cl, CN, $CF_3$, phenyl or alkyl with 1 to 5 C-atoms, in particular H, $C_1$ or $CH_3$, $W^2$ and $W^3$ being independently of each other H or alkyl with 1 to 5 C-atoms, in particular H, methyl, ethyl or n-propyl, $W^4$, $W^5$ and $W^6$ being independently of each other Cl, oxaalkyl or oxacarbonylalkyl with 1 to 5 C-atoms, $W^7$ and $W^8$ being independently of each other H, Cl or alkyl with 1 to 5 C-atoms, Phe being 1,4-phenylene that is optionally substituted by one or more groups L as defined above, and $k_1$ and $k_2$ being independently of each other 0 or 1.

Alternatively P is a protected derivative of these groups which is non-reactive under the conditions described for the process according to the present invention. Suitable protective groups are known to the ordinary expert and described in the literature, for example in Green, "Protective Groups in Organic Synthesis", John Wiley and Sons, New York (1981), like for example acetals or ketals.

Especially preferred groups P are $CH_2$=CH—COO—, $CH_2$=C($CH_3$)—COO—, $CH_2$=CH—, $CH_2$=CH—O—, ($CH_2$=CH)$_2$CH—OCO—, ($CH_2$=CH)$_2$CH—O—,

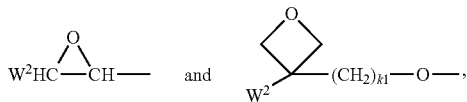

or protected derivatives thereof.

Polymerisation of group P can be carried out according to methods that are known to the ordinary expert and described in the literature, for example in D. J. Broer; G. Challa; G. N. Mol, *Macromol. Chem.*, 1991, 192, 59.

The term "spacer group" is known in prior art and suitable spacer groups Sp are known to the ordinary expert (see e.g. Pure Appl. Chem. 73(5), 888 (2001). The spacer group Sp is preferably of formula Sp'-X', such that P-Sp- is P-Sp'-X'—, wherein Sp' is alkylene with up to 30 C atoms which is unsubstituted or mono- or polysubstituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, X' is —O—, —S—, —CO—, —COO—, —OCO—, —O—COO—, —CO—$NR^0$—, —$NR^0$—CO—, —$NR^0$—CO—$NR^{00}$—, —$OCH_2$—, —$CH_2$O—, —$SCH_2$—, —$CH_2$S—, —$CF_2$O—, —$OCF_2$—, —$CF_2$S—, —$SCF_2$—, —$CF_2CH_2$—, —$CH_2CF_2$—, —$CF_2CF_2$—, —CH=N—, —N=CH—, —N=N—, —CH=$CR^0$—, —$CY^1$=$CY^2$—, —C≡C—, —CH=CH—COO—, —OCO—CH=CH— or a single bond, $R^0$ and $R^{00}$ are independently of each other H or alkyl with 1 to 12 C-atoms, and $Y^1$ and $Y^2$ are independently of each other H, F, Cl or CN.

X' is preferably —O—, —S—, —$OCH_2$—, —$CH_2$O—, —$SCH_2$—, —$CH_2$S—, —$CF_2$O—, —$OCF_2$—, —$CF_2$S—, —$SCF_2$—, —$CH_2CH_2$—, —$CF_2CH_2$—, —$CH_2CF_2$—, —$CF_2CF_2$—, —CH=N—, —N=CH—, —N=N—, —CH=$CR^0$—, —$CY^1$=$CY^2$—, —C≡C— or a single bond, in particular —O—, —S—, —C≡C—, —$CY^1$=$CY^2$— or a single bond. In another preferred embodiment X' is a group that is able to form a conjugated system, such as —C≡C— or —$CY^1$=$CY^2$—, or a single bond.

Typical groups Sp' are, for example, —($CH_2$)$_p$—, —($CH_2CH_2$O)$_q$—$CH_2CH_2$—, —$CH_2CH_2$—S—$CH_2CH_2$— or —$CH_2CH_2$—NH—$CH_2CH_2$— or —(Si$R^0R^{00}$—O)$_p$—, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

The polymers of the present invention can be synthesized according to or in analogy to methods that are known to the skilled person and are described in the literature. Other methods of preparation can be taken from the examples. For example, they can be suitably prepared by aryl-aryl coupling reactions, such as Yamamoto coupling, Suzuki coupling, Stille coupling, Sonogashira coupling or Heck coupling. Suzuki coupling and Yamamoto coupling are especially preferred.

The monomers which are polymerised to form the repeat units of the polymers can be prepared according to methods which are known to the person skilled in the art.

Another aspect of the invention is a process for preparing a polymer by coupling one or more identical or different monomers based on a unit of formula I, preferably selected of formula II or III1, with each other and/or with one or more comonomers, in a polymerisation reaction, preferably an aryl-aryl coupling reaction.

Suitable and preferred comonomers are those of the formula $R^7$—Ar—$R^8$ wherein Ar, $R^7$ and $R^8$ are as defined above.

Preferred methods for polymerisation are those leading to C—C-coupling or C—N-coupling, like Suzuki polymerisation, as described for example in WO 00/53656, Yamamoto polymerisation, as described in for example in T. Yamamoto et al., Progress in Polymer Science 1993, 17, 1153-1205 or in WO 2004/022626 A1, and Stille coupling. For example, when synthesizing a linear polymer by Yamamoto polymerisation, monomers as described above having two reactive halide groups $R^{7,8}$ is preferably used. When synthesizing a linear polymer by Suzuki polymerisation, preferably a monomer as described above is used wherein at least one reactive group $R^{7,8}$ is a boronic acid or boronic acid derivative group.

Suzuki polymerisation may be used to prepare homopolymers as well as statistical, alternating and block random copolymers. Statistical or block copolymers can be prepared for example from the above monomers of formula II wherein one of the reactive groups $R^7$ and $R^8$ is halogen and the other reactive group is a boronic acid or boronic acid derivative group. The synthesis of statistical, alternating and block copolymers is described in detail for example in WO 03/048225 A2 or WO 2005/014688 A2.

As alternatives to halogens as described above, preferred leaving groups are those of formula —O—$SO_2$Z can be used as $R^7$ or $R^8$, wherein Z is optionally substituted alkyl or aryl or a combination thereof, preferably fluorinated alkyl with 1 to 12 C atoms, or aryl or alkylaryl with 6 to 12 C atoms. Particularly preferred examples of such leaving groups are O-tosylate, O-mesylate, O-triflate and O-nonaflate.

Suzuki polymerisation employs a Pd(0) complex or a Pd(II) salt. Preferred Pd(0) complexes are those bearing at least one phosphine ligand such as $Pd(Ph_3P)_4$. Another preferred phosphine ligand is tris(ortho-tolyl)phosphine, i.e. $Pd(o-Tol)_4$. Preferred Pd(II) salts include palladium acetate, i.e. $Pd(OAc)_2$. Suzuki polymerisation is performed in the presence of a base, for example sodium carbonate, potassium phosphate or an organic base such as tetraethylammonium carbonate. Yamamoto polymerisation employs a Ni(0) complex, for example bis(1,5-cyclooctadienyl) nickel(0).

Especially suitable and preferred synthesis methods of the repeating units and monomers of formula I, II and III and their homo- and co-polymers of formula Ia and Ib are illustrated in the synthesis schemes shown hereinafter. Therein R has one of the meanings of $R^1$ given in formula I and Ar has one of the meanings of formula I or of the preferred meanings given above and below.

Two preferred synthesis routes to bis(thienocyclpenta)benzothiadiazole units with alkyl substitutents $R^{1-4}$ (10) are exemplarily illustrated in Schemes 1 and 2 below.

Scheme 1

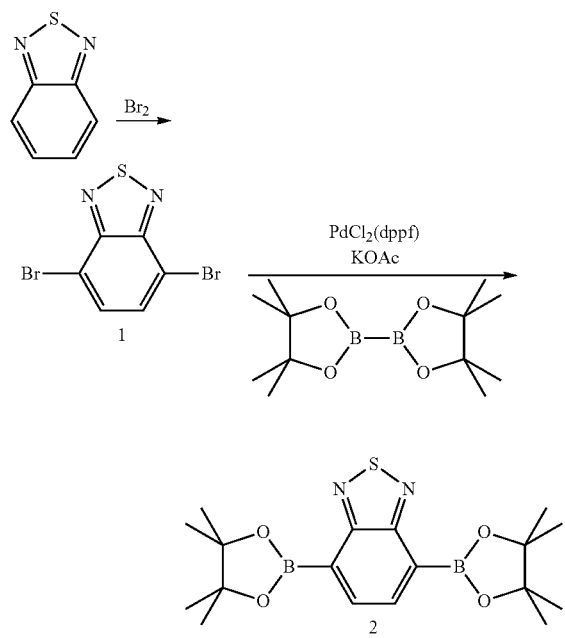

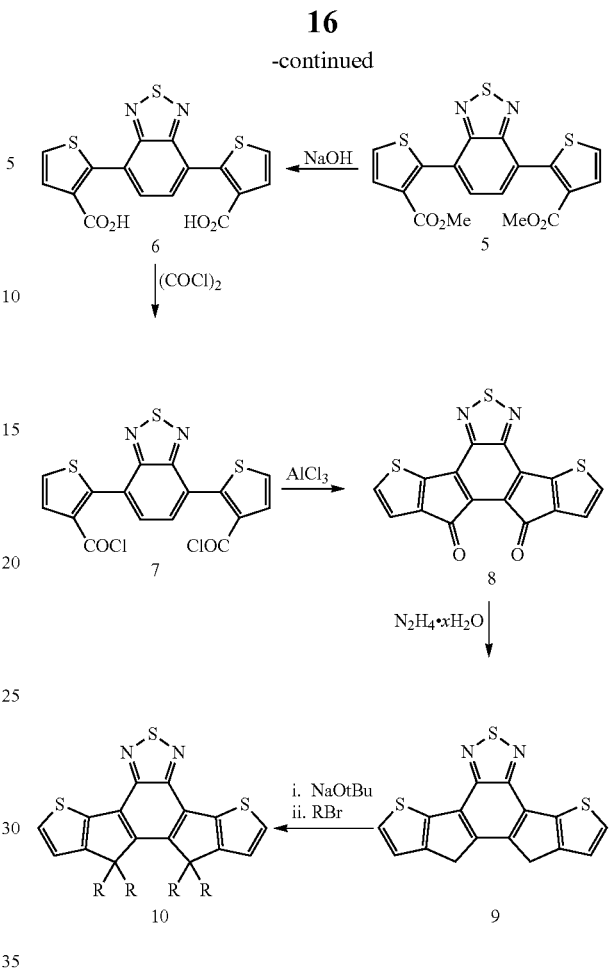

Benzothiadiazole is brominated to form dibromide 1, which is converted to bis-boronate 2 using bis(pinacolato) diboron under palladium-catalysed conditions. Meanwhile, thiophene-3-carboxylic acid is treated with lithium diisopropylamide (LDA) followed by carbon tetrabromide to form carboxylic acid 3, which is converted to carboxylate 4 via the carboxylic acid chloride. Reaction of carboxylate 4 and bis-boronate 2 via a Suzuki cross-coupling yields dicarboxylate 5. Dicarboxylate 5 is saponified to dicarboxylic acid 6, which is then converted to dicarboxylic acid chloride 7 using oxalyl chloride. Cyclisation of dicarboxylic acid chloride 7 under Friedel Crafts conditions forms bis(thienocyclpenta)benzothiadiazole-6,7-dione 8. Reduction of diketone 8 with hydrazine hydrate forms bis(thienocyclpenta)benzothiadiazole 9, which can then be alkylated using sodium tert-butoxide followed by addition of bromoalkane to form bis(dialkylthienocyclpenta)benzothiadiazole 10.

Scheme 2

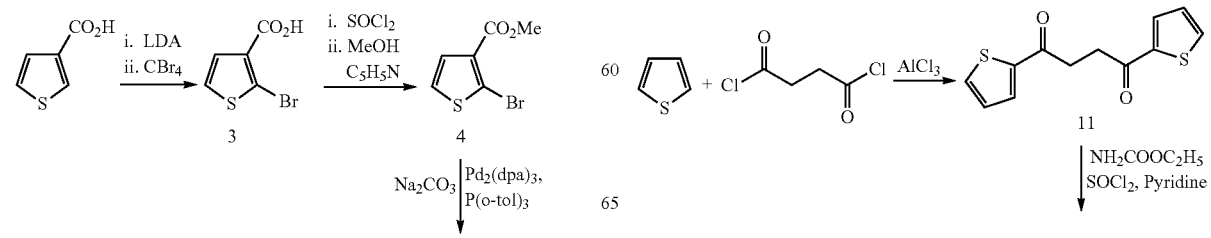

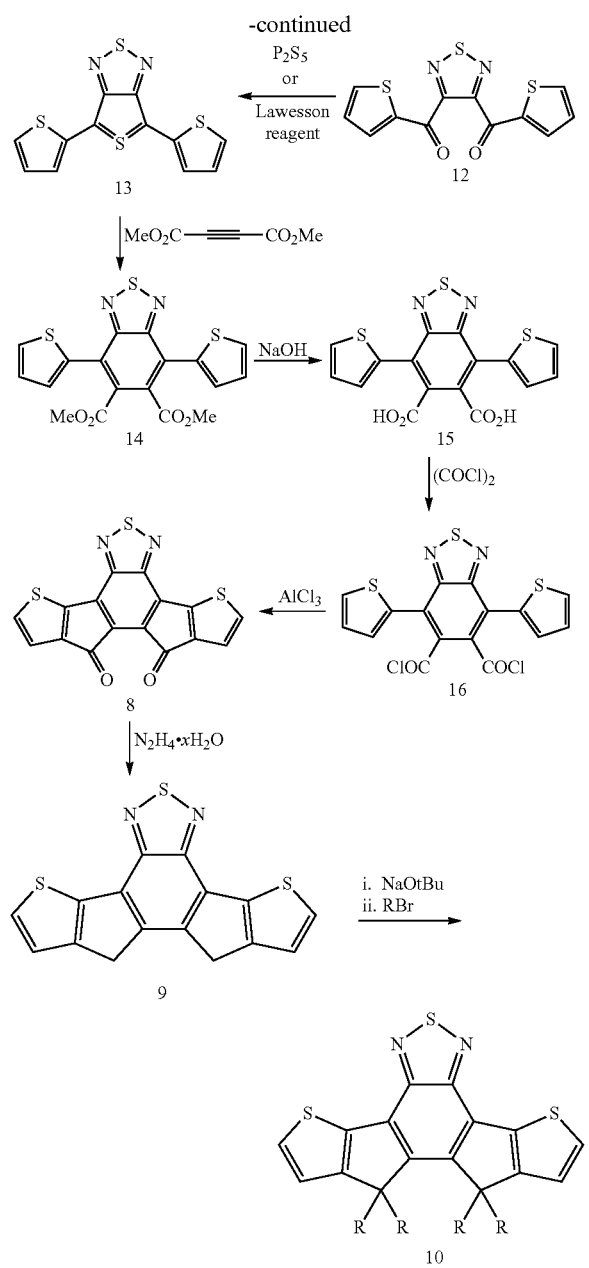

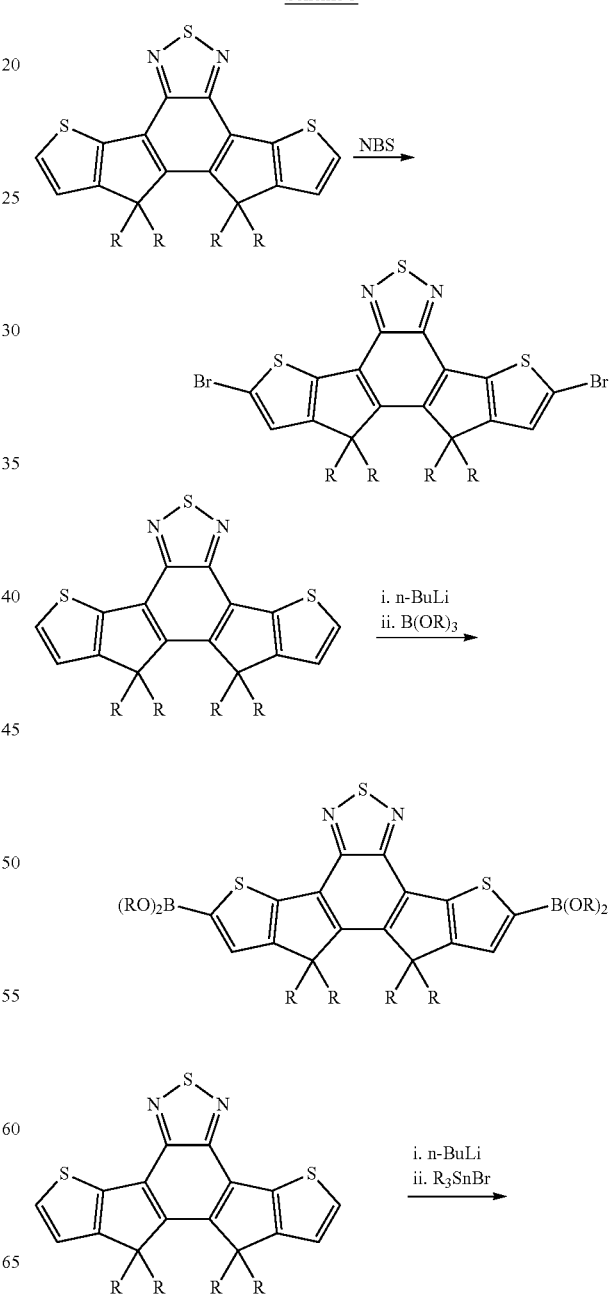

under Friedel Crafts conditions forms bis(thienocyclpenta) benzothiadiazole-6,7-dione 8. Reduction of diketone 8 with hydrazine hydrate forms bis(thienocyclpenta)benzothiadiazole 9, which can then be alkylated using sodium tert-butoxide followed by addition of bromoalkane to form bis(dialkylthienocyclpenta)benzothiadiazole 10.

The structural analogous compounds with selenophene or benzene rings instead of the thiophene rings can be prepared by the same methods as described above, but using the corresponding selenophene or benzene educts or functionalised derivatives thereof.

The functionalisation of bis(dialkylthienocyclpenta)-benzothiadiazole is exemplarily illustrated in Scheme 3 below.

Scheme 3

1,2-Dithien-2-oylethane 11 is prepared by Friedel Crafts acylation of thiophene with succinyl chloride. Reaction of diketone 11 with thiazyl chloride ('Katz reagent', NSCl), which is generated from a mixture of ethyl carbamate, thionyl chloride and pyridine, forms thiadiazole 12. [see S. M. Laaman, O. Meth-Cohn and C. W. Rees, *ARKIVOC*, 2002, (iii), 903; and S. Shi, T. J. Katz, B. V. Yang and L. Liu, *J. Org. Chem.*, 1995, 60, 1285]. Reaction of thiadiazole 12 with phosphorus pentasulfide [see J. D. Bower and R. H. Schlessinger, *J. Am. Chem. Soc.*, 1969, 91:24, 6891], or alternatively with a milder reagent e.g. Lawesson reagent forms thiadiazole 13, which contains a tetravalent bonding sulphur. Cycloaddition of thiadiazole 13 with dimethyl acetylenedicarboxylate results in the formation of dicarboxylate 14 [see O. Tsuge and T. Takata, *J. Org. Chem.*, 1980, 45, 2956]. Dicarboxylate 14 is saponified to dicarboxylic acid 15, which is then converted to dicarboxylic acid chloride 16 using oxalyl chloride. Cyclisation of dicarboxylic acid chloride 16

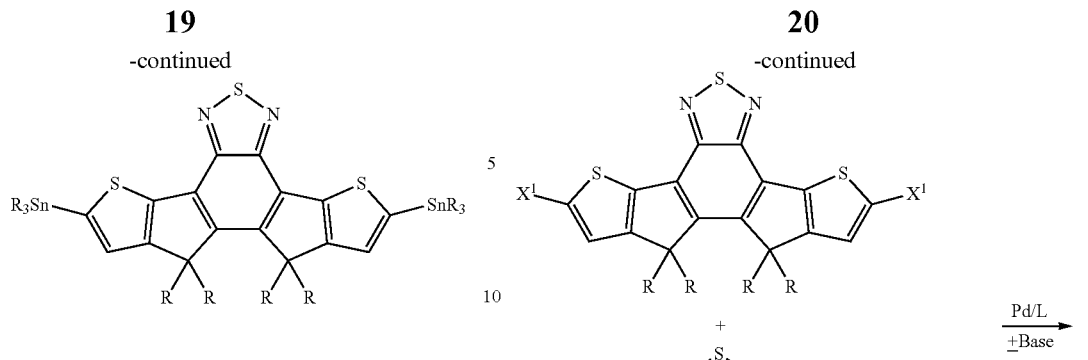

The homopolymerisation of bis(dialkylthienocyclpenta)benzothiadiazole is exemplarily illustrated in Scheme 4 below.

Scheme 4

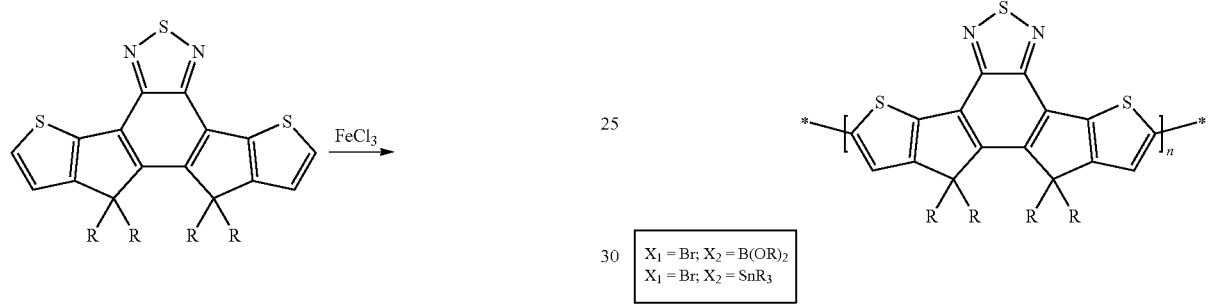

The co-polymerisation of bis(dialkylthienocyclpenta)benzothiadiazole is exemplarily illustrated in Scheme 5 below.

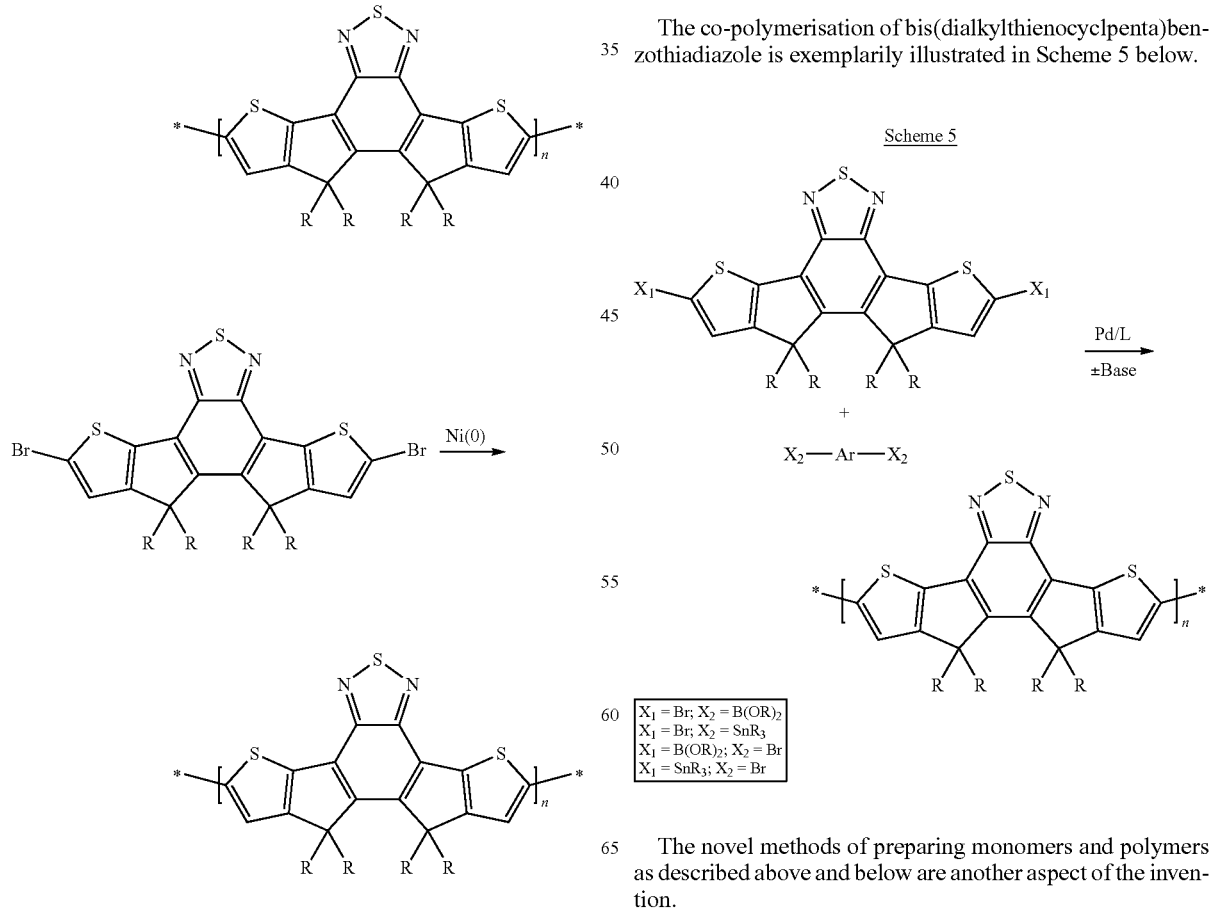

The novel methods of preparing monomers and polymers as described above and below are another aspect of the invention.

The polymers according to the present invention are useful as charge transport, semiconducting, electrically conducting, photoconducting or light mitting materials in optical, electrooptical, electronic, electroluminescent or photoluminescent components or devices.

Especially preferred devices are OFETs, TFTs, ICs, logic circuits, capacitors, RFID tags, OLEDs, OLETs, OPVs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns. In these devices, the polymers of the present invention are typically applied as thin layers or films.

OFETs where an organic semiconducting (OSC) material is arranged as a thin film between a gate dielectric and a drain and a source electrode, are generally known, and are described for example in U.S. Pat. No. 5,892,244, WO 00/79617, U.S. Pat. No. 5,998,804, and in the references cited in the background section. Due to the advantages, like low cost production using the solubility properties of the polymers according to the invention and thus the processibility of large surfaces, preferred applications of these FETs are such as integrated circuitry, TFT displays and security applications.

The polymers according to the present invention can also be used in polymer blends, for example together with other polymers having charge-transport, semiconducting, electrically conducting, photoconducting and/or light emitting semiconducting properties, or for example with polymers having hole blocking or electron blocking properties for use as interlayers or charge blocking layers in OLED devices. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more polymers or polymer blends as described above and below and one or more organic solvents.

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and/or mixtures thereof.

The concentration of the polymers in the solution is preferably 0.1 to 10% by weight, more preferably 0.5 to 5% by weight. Optionally, the solution also comprises one or more binders to adjust the rheological properties, as described for example in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

The polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared.

Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents methoned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymers or formulations according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

An OFET device according to the present invention preferably comprises:
a source electrode,
a drain electrode,
a gate electrode,
an organic semiconducting (OSC) layer,
one or more gate insulator layers,
optionally a substrate,
wherein the OSC layer comprises one or more polymers according to the present invention.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer. The OFET device can be a top gate device or a bottom gate device. Suitable structures and manufacturing methods of an OFET device are known to the skilled in the art and are described in the literature, for example in WO 03/052841.

An OPV device according to the present invention preferably comprises:
a low work function electrode (for example Aluminum),
a high work function electrode (for example ITO), one of which is transparent,
a bilayer of consisting of a hole transporting and an electron transporting material; the bilayer can exist as two distinct layers, or as a blended mixture, a so-called bulk heterojunction (BHJ) (see for example Coakley, K. M. and McGehee, M. D. Chem. Mater. 2004, 16, 4533),
an optional conducting polymer layer (such as for example PEDOT:PSS) to modify the work function of the high work function electrode to provide an ohmic contact for the hole,
an optional coating on the high work function electrode (such as LiF) to provide an ohmic contact for electrons.

The hole transporting polymer in the blend exists of one of the polymers of the present invention. The electron transporting material can be an inorganic material such as zinc oxide or cadmium selenide, or an organic material such as a fullerene derivate (for example PCBM, [(6,6)-phenyl C61-butyric acid methyl ester] or a polymer see for example Coakley, K. M. and McGehee, M. D. Chem. Mater. 2004, 16, 4533). For the blended mixture, an optional annealing step may be necessary to optimize blend morphology and consequently OPV device performance.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetary value, like stamps, tickets, shares, cheques etc.

Alternatively, the materials according to the invention can be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the materials according to the present invention, especially those which show photoluminescent properties, may be employed as materials of light sources, e.g., of display devices such as described in EP 0 889 350 A1 or by C. Weder et al., Science, 279, 1998, 835-837.

A further aspect of the invention relates to both the oxidised and reduced form of the polymers according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^+)$, $(NO_2^+)$ $(SbCl_6^-)$, $(NO_2^+)$ $(BF_4^-)$, $AgClO_4$, $H_2IrCl_6$, $La(NO_3)_3.6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the polymers of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913.

According to another use the materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, Proc. Natl. Acad. Sci. U.S.A. 1999, 96, 12287; D. Wang, X. Gong, P. S. Heeger, F. Rininsland, G. C. Bazan and A. J. Heeger, Proc. Natl. Acad. Sci. U.S.A. 2002, 99, 49; N. DiCesare, M. R. Pinot, K. S. Schanze and J. R. Lakowicz, Langmuir 2002, 18, 7785; D. T. McQuade, A. E. Pullen, T. M. Swager, Chem. Rev. 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention will now be described in more detail by reference to the following examples, which are illustrative only and do not limit the scope of the invention.

EXAMPLE 1

Preparation of 1,2,5-thiadiazole-3,4-diylbis(2-thienyl)

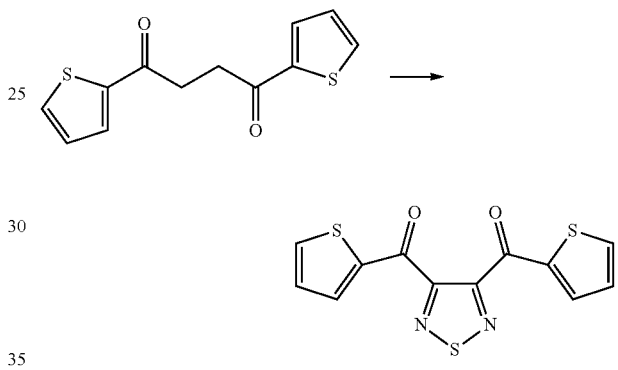

A solution of ethyl carbamate (1.61 g, 18 mmol), anhydrous toluene (88 cm³), anhydrous pyridine (8 cm³) and thionyl chloride (1.32 cm³) is stirred at 23° C. for 30 minutes. To this is added 1,4-di-2-thienyl-1,4-butanedione (1.05 g, 4.2 mmol) and the reaction mixture heated at reflux for 65 hours.

The mixture is allowed to cool to 23° C. and the solvent removed in vacuo. The crude product is taken up in dichloromethane (150 cm³) and the organic washed with aqueous hydrochloric acid (2 M, 3×70 cm³) and water (100 cm³). The organic is then dried over anhydrous magnesium sulphate, filtered and the solvent removed in vacuo. The crude product is purified by column chromatography (eluent: gradient of petroleum ether 40-60 to 35% ethyl acetate in petroleum ether 40-60) to yield a red oil containing starting material (56 mg, 4%) and product (224 mg, 17%). MS (m/e): 306 (M⁺), 111. Used without further purification.

Preparation of 2,1,3-benzothiadiazole-5,6-dimethyl ester-4,7-di(2-thienyl)

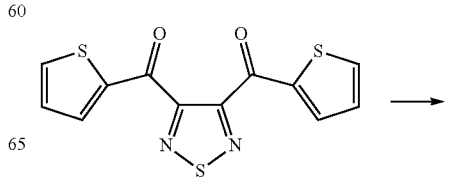

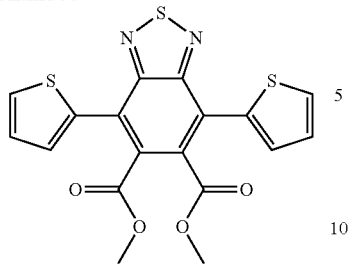

A mixture of 1,2,5-thiadiazole-3,4-diylbis(2-thienyl) (500 mg, 1.0 mmol), anhydrous toluene (20 cm³) and Lawesson's reagent (860 mg, 2.1 mmol) is stirred at 23° C. for 3 hours. Dimethyl acetylenedicarboxylate (0.26 cm³, 2.1 mmol) is then added and the reaction mixture heated at reflux for 3 hours and then at 23° C. for 17 hours. To the mixture is added dichloromethane (50 cm³) and the crude mixture pre-absorbed onto silica.

The product is purified by column chromatography (eluent: gradient of petroleum ether 40-60 to 25% ethyl acetate in petroleum ether 40-60) to yield product as a yellow/green solid (140 mg, 33%). MS (m/e): 416 (M⁺), 385, 370, 298. ¹H NMR (300 MHz, CDCl₃): σ(ppm) 7.60 (dd, J=5.0, 1.2 Hz, 2H, Ar—H), 7.43 (dd, J=3.6, 1.2 Hz, 2H, Ar—H), 7.20 (dd, J=5.0, 3.6 Hz, 2H, Ar—H), 3.76 (s, 6H, CH₃).

Preparation of 2,1,3-benzothiadiazole-5,6-dicarboxylic acid-4,7-di(2-thienyl)

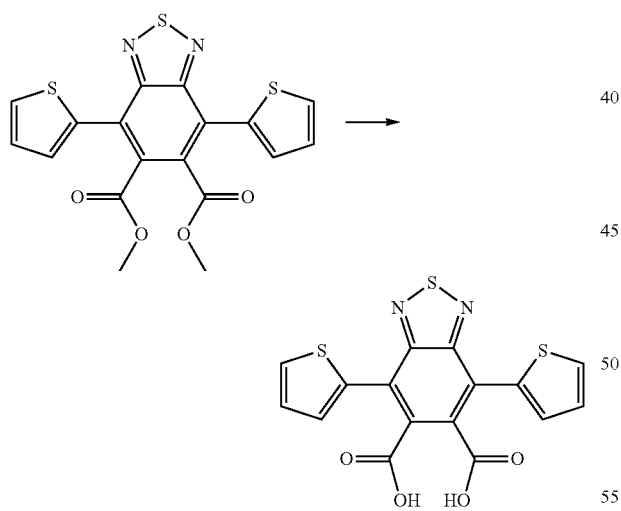

To a solution of sodium hydroxide (600 mg, 15 mmol) in water (4 cm³) is added ethanol (30 cm³) followed by 2,1,3-benzothiadiazole-5,6-dimethyl ester-4,7-di(2-thienyl) (680 mg, 1.63 mmol) and the mixture heated at reflux for 17 hours. The mixture is concentrated in vacuo, water (100 cm³) added and the mixture neutralized with conc. hydrochloric acid. The formed precipitate is collected by filtration, washed with water and dried under vacuum to give product as a yellow solid (630 mg, 99%). ¹H NMR (300 MHz, d⁶-DMSO): δ(ppm) 7.94 (dd, J=5.0, 1.2 Hz, 2H, Ar—H), 7.53 (dd, J=3.6, 1.2 Hz, 2H, Ar—H), 7.31 (dd, J=5.0, 3.6 Hz, 2H, Ar—H).

Preparation of 1,8-dihydro-s-indaceno-4,5-(2,1,3-thiadiazole)[1,2-b:5,6-b']dithiophene-1,8-dione

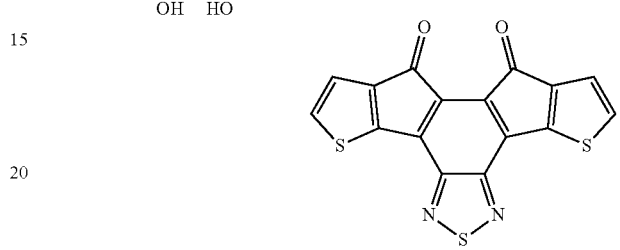

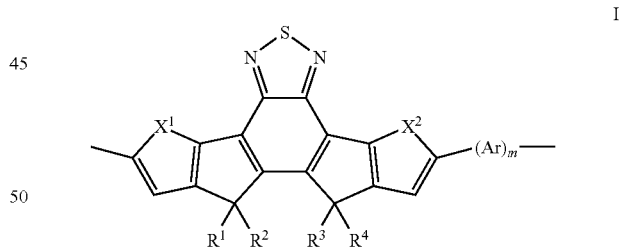

To a solution of 2,1,3-benzothiadiazole-5,6-dicarboxylic acid-4,7-di(2-thienyl) (630 mg, 1.6 mmol) and oxalyl chloride (1.6 cm³, 2.0 M in dichloromethane, 3.2 mmol) in anhydrous dichloromethane (20 cm³) at 0° C. is added dropwise anhydrous N,N-dimethylformamide (0.15 cm³). The mixture is then allowed to warm to 23° C. over 17 hours. The volatiles removed in vacuo to give an orange/red solid. This solid is taken up in anhydrous dichloromethane (35 cm³) and added to a suspension of anhydrous aluminium chloride (680 mg, 12 mmol) in anhydrous dichloromethane (20 cm³). The resulting mixture is heated at reflux for 17 hours. The mixture is allowed to cool to 23° C., and poured into ice-water and the resulting precipitate is filtered and dried under vacuum to give product as a black solid (610 mg). IR: ν(cm⁻¹) 1701 (C=O).

The invention claimed is:

1. Conjugated polymer comprising one or more identical or different repeating units of formula I wherein
X¹ and X² denote independently of each other S, Se or —CR¹=CR²—,
R¹⁻⁴ are identical or different groups independently of each other selected from H, halogen, —CN, —NC, —NCO, —NCS, —OCN, —SCN, —C(=O)NR⁰R⁰⁰, —C(=O) X⁰, —C(=O)R⁰, —NH₂, —NR⁰R⁰⁰, —SH, —SR⁰, —SO₃H, —SO₂R⁰, —OH, —NO₂, —CF₃, —SF₅, P-Sp-, optionally substituted silyl, or carbyl or hydrocarbyl with 1 to 40 C atoms that is optionally substituted and optionally comprises one or more hetero atoms,
P is a polymerisable group,
Sp is a spacer group or a single bond,
X⁰ is halogen, $R^0$ and $R^{00}$ are independently of each other H or an optionally substituted carbyl or hydrocarbyl group optionally comprising one or more hetero atoms, Ar is in each occurrence independently of one another are an optionally substituted aryl or heterorayl group, —$CY^1$=$CY^2$— or —C≡C—, $Y^1$ and $Y^2$ are independently of each other H, F, Cl or CN, m is in each occurrence independently of one another 0, 1, 2, 3 or 4.

2. Polymer according to claim 1, selected of formula Ia

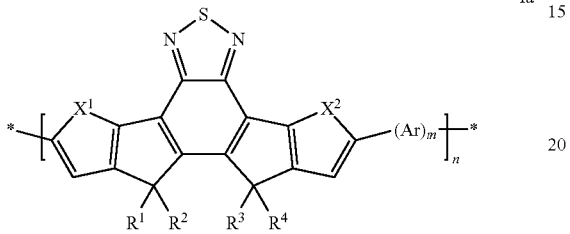

Ia wherein $X^{1,2}$, $R^{1-4}$, Ar and m have the meanings of claim 1 and n is an integer >1.

3. Polymer according to claim 2, selected of formula Ib

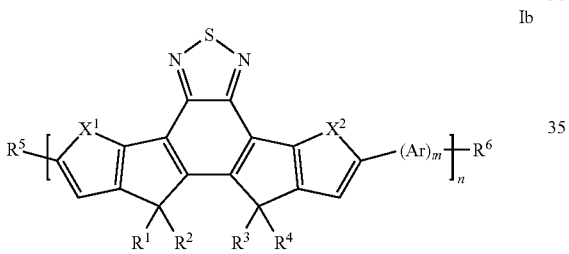

Ib wherein $X^{1,2}$, $R^{1-4}$, Ar, m and n have the meanings of claim 2, and $R^5$ and $R^6$ independently of each other have one of the meanings of $R^1$ or denote —$CH_2Cl$, —CHO, —CH=$CH_2$—SiR'R"R''', —SnR'R"R''', —BR'R", —B(OR')(OR"), —B(OH)$_2$, or P-Sp, wherein P and Sp are as defined above, and R', R" and R''' have independently of each other one of the meanings of $R^0$ given above and R' and R" may also form a ring together with the hetero atom to which the are attached.

4. Polymer according to claim 1, comprising one or more identical or different repeating units selected from the group consisting of the following subformulae:

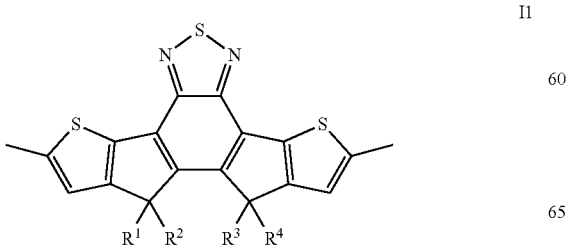

I1

-continued

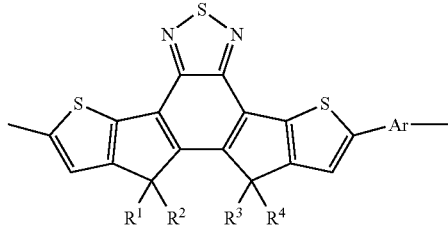

I2

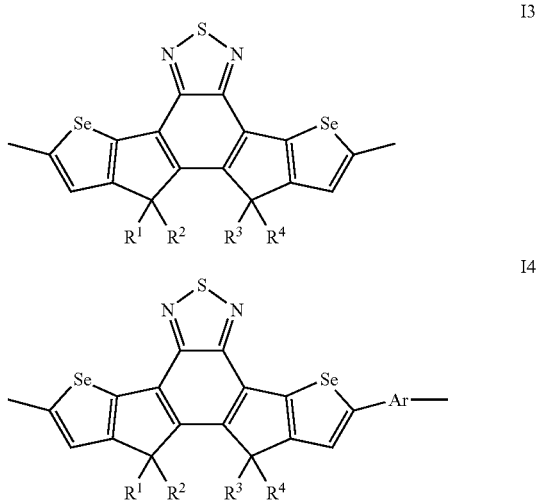

I3

I4

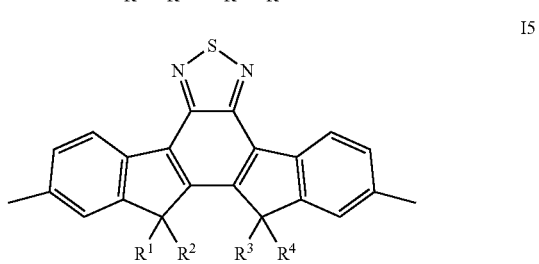

I5

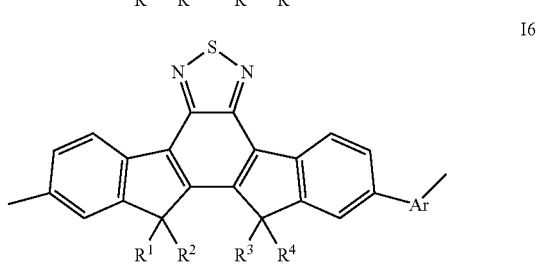

I6 wherein $R^{1-4}$, Ar and n are as defined in claim 1.

5. Polymer according to claim 2, selected from the group consisting of the following subformulae:

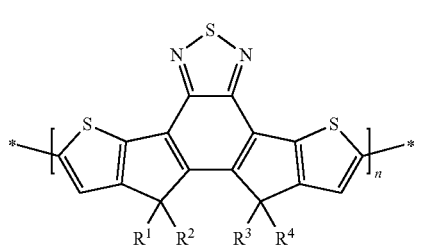

Ia1

Ia2
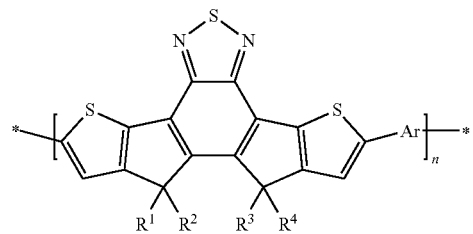
Ia3
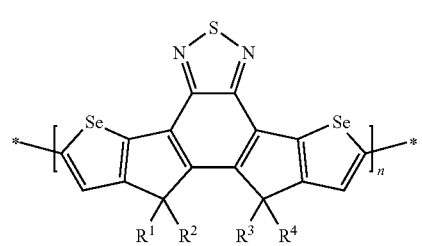
Ia4
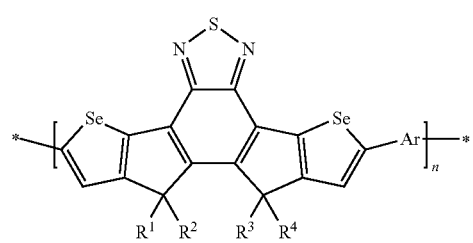
Ia5
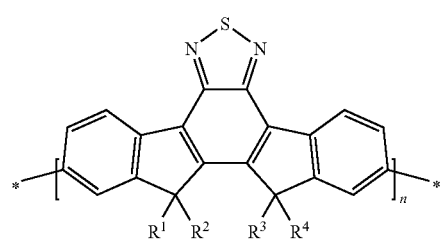
Ia6
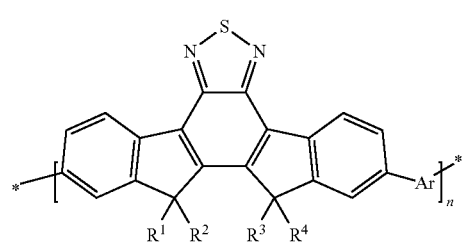
wherein $R^{1-4}$, Ar and n are as defined in claim 2.
6. Polymer according to claim 3, selected of formula Ib1:
$$R^5\text{—}(MU)_n\text{—}R^6 \qquad \text{Ib1}$$
wherein $R^5$, $R^6$ and n are as defined in claim 3, and "MU" is a monomeric repeating unit selected from the group consisting of subformulae I1-I6
1
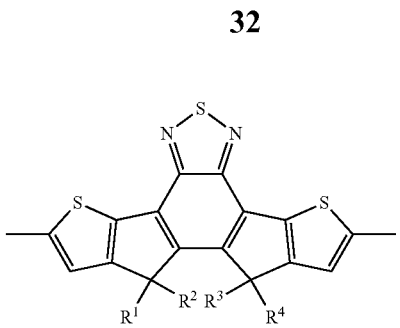
2
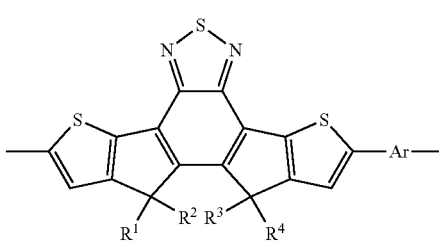
3
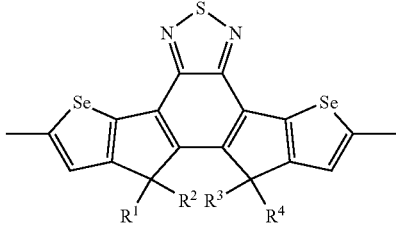
4
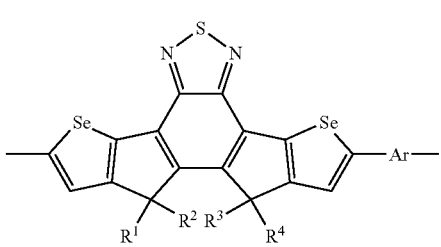
5
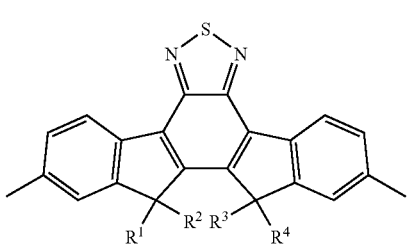
6
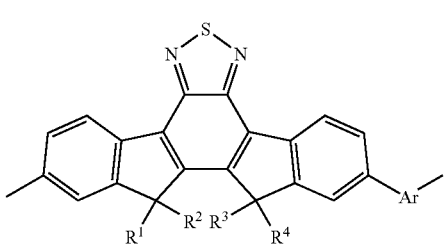

7. Monomer of formula II

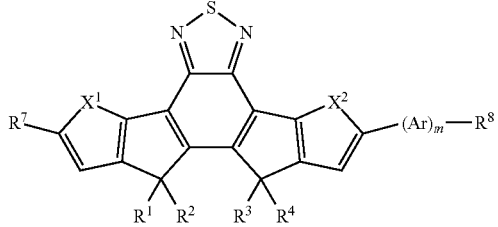

wherein

- $X^1$ and $X^2$ denote independently of each other S, Se or —$CR^1$=$CR^2$—,
- $R^{1-4}$ are identical or different groups independently of each other selected from H, halogen, —CN, —NC, —NCO, —NCS, —OCN, —SCN, —C(=O)$NR^0R^{00}$, —C(=O)$X^0$, —C(=O)$R^0$, —$NH_2$, —$NR^0R^{00}$, —SH, —$SR^0$, —$SO_3H$, —$SO_2R^0$, —OH, —$NO_2$ —$CF_3$—$SF_5$, P-Sp-, optionally substituted silyl, or carbyl or hydrocarbyl with 1 to 40 C atoms that is optionally substituted and optionally comprises one or more hetero atoms,
- Ar is in each occurrence independently of one another are an optionally substituted aryl or heterorayl group, —$CY^1$=$CY^2$-or —C≡C—,
- m is in each occurrence independently of one another 0, 2, 2, 3 or 4,
- $R^7$ and $R^8$ denote independently of each other halogen, —$CH_2Cl$, —CHO, —CH=$CH_2$ —SiR'R"R'", —SnR'R"R'", —BR'R", —B(OR')(OR"), —$B(OH)_2$, a leaving group or P-Sp,
- P is a polymerisable group,
- Sp is a spacer group or a single bond, and
- R', R" and R'" are, have independently of each other halogen, H or an optionally substituted carbyl or hydrocarbyl group optionally comprising one or more hetero atoms, and R' and R" may also form a ring together with the hetero atom to which the are attached.

8. Monomer of claim 7, selected of formula III:

$$R^7\text{—MU—}R^8 \qquad \text{III}$$

wherein $R^7$ and $R^8$ are as defined, and "MU" is a monomeric unit selected from the group consisting of subformulae II-I6 of

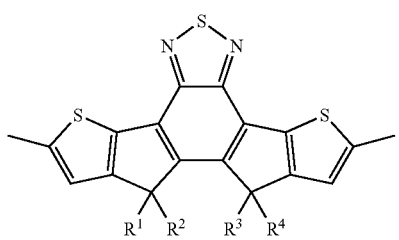

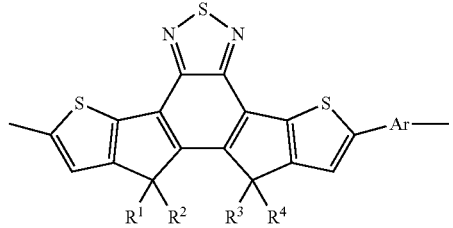

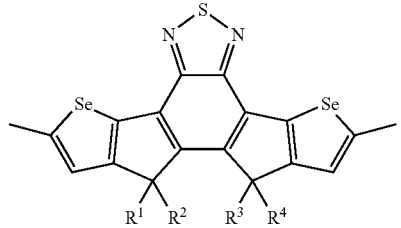

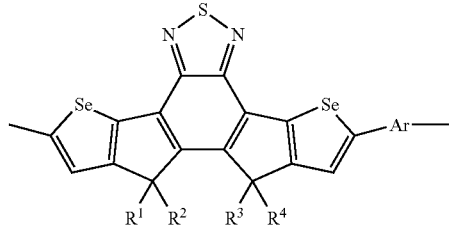

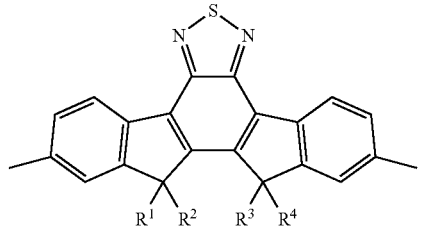

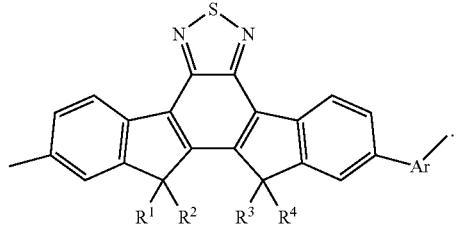

9. Polymer or monomer according to claim 1, wherein Ar is independently of each other selected from the group consisting of 2,1,3-benzothiadiazole-4,7-diyl, 2,1,3-benzoselenadiazole-4,7-diyl, 2,3-dicyano-1,4-phenylene, 2,5-dicyano,1,4-phenylene, 2,3-difluoro-1,4-phenylene, 2,5-difluoro,1,4-phenylene, 2,3,5,6-tetrafluoro,1,4-phenylene, 3,4-difluorothiophene-2,5-diyl, thieno[3,4-b]pyrazine-2,5-diyl, quinoxaline-5,8-diyl, selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, 1,4-phenylene, pyridine-2,5-diyl, pyrimidine-2,5-diyl, p-p'-biphenyl, naphthalene-2,6-diyl, benzo[1,2-b:4,5-b']dithiophene-2,6-diyl, 2,2-dithiophene, 2,2-diselenophene, thiazole and oxazole, all of which are unsubstituted, mono- or polysubstituted with $R^1$ as defined in claim 1.

10. Polymer or monomer according to claim 1, wherein $R^{1-4}$ are independently of each other selected from straight-chain or branched-chain, $C_1$-$C_{20}$-alkyl, $C_1$-$C_{20}$-alkoxy, $C_2$-$C_{20}$-alkenyl, $C_2$-$C_{20}$-alkynyl, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl.

11. Polymer blend comprising one or more polymers according to claim 1 and one or more polymers, preferably selected from polymers having semiconducting, charge transport, hole/electron transport, hole/electron blocking, electrically conducting, photoconducting or light emitting properties.

12. Formulation comprising one or more monomers, polymers or polymer blends according to claim 1 and one or more solvents.

13. In a optical, electrooptical, electronic, electroluminescent or photoluminescent component or device containing a charge transport, semiconducting, electrically conducting, photoconducting or light emitting material, the improvement wherein said material contains a polymer according to claim 1.

14. Optical, electrooptical or electronic component or device comprising one or more monomers, polymers, polymer blends or formulations according to claim 1.

15. Component or device according to claim 14, selected from the group consisting of organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic (OPV) devices, solar cells, laser diodes, photoconductors, photodetectors, electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

16. Component or device according to claim 14, which is a bulk heterojunction OPV device.

17. Process of preparing a polymer according to claim 1, comprising:
subjecting one or more monomers according to formula II,

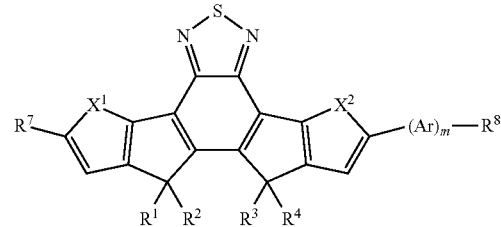

wherein
$X^1$ and $X^2$ denote independently of each other S, Se or —$CR^1$=$CR^2$—,
$R^{1-4}$ are identical or different groups independently of each other selected from H, halogen, —CN, —NC, —NCO, —NCS, —OCN, —SCN, —C(=O)$NR^0R^{00}$, —C(=O)$X^0$, —C(=O)$R^0$—$NH_2$, —$NR^0R^{00}$, —SH, —$SR^0$, —$SO_3H$ -$SO_2R^0$, —OH, —$NO_2$ —$CF_3$, —$SF_5$, P-Sp-, optionally substituted silyl, or carbyl or hydrocarbyl with 1 to 40 C atoms that is optionally substituted and optionally comprises one or more hetero atoms,
Ar is in each occurrence independently of one another are an optionally substituted aryl or heterorayl group, —$CY^1$=$CY^2$- or -CC≡C—,
m is in each occurrence independently of one another 0, 1, 2, 3 or 4,
$R^7$ and $R^8$ denote independently of each other halogen, —$CH_2Cl$, —CHO, —CH=$CH_2$ -SiR'R"R''', —SnR'R"R''', —BR'R", —B(OR')(OR"), —B(OH)$_2$ a leaving group or P-Sp,
P is a polymerisable group,
Sp is a spacer group or a single bond, and
R', R" and R''' are, have independently of each other, halogen, H or an optionally substituted carbyl or hydrocarbyl group optionally comprising one or more hetero atoms, and R' and R" may also form a ring together with the hetero atom to which the are attached,
and optionally one or more monomers of the formula $R^7$-Ar-$R^8$ wherein $R^7$, $R^8$ and Ar are as defined for formula II, to an aryl-aryl coupling reaction.

* * * * *